United States Patent
Hofmann et al.

(10) Patent No.: US 6,442,065 B1
(45) Date of Patent: Aug. 27, 2002

(54) METHOD FOR OPERATING A MEMORY CELL CONFIGURATION HAVING DYNAMIC GAIN MEMORY CELLS

(75) Inventors: Franz Hofmann, München; Wolfgang Krautschneider, Hamburg; Till Schlösser, Dresden; Josef Willer, Riemerling, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/935,356

(22) Filed: Aug. 22, 2001

Related U.S. Application Data (63) Continuation of application No. PCT/DE00/00282, filed on Feb. 1, 2000.

(30) Foreign Application Priority Data

Feb. 22, 1999 (DE) .......................... 199 07 540

(51) Int. Cl.$^7$ .............................................. G11C 11/40
(52) U.S. Cl. ...................................... 365/175; 365/174
(58) Field of Search ................................ 365/175, 174, 365/177, 149; 257/365, 366, 369

(56) References Cited

U.S. PATENT DOCUMENTS

| | | | |
|---|---|---|---|
| 3,786,437 A | | 1/1974 | Croxon et al. ............... 365/222 |
| 5,463,234 A | | 10/1995 | Toriumi et al. ............... 257/296 |
| 5,581,106 A | | 12/1996 | Hayashi et al. ............. 257/369 |
| 5,757,693 A | * | 5/1998 | Houghton et al. ........... 365/149 |
| 5,912,840 A | * | 6/1999 | Gonzalez et al. ........... 365/175 |

* cited by examiner

*Primary Examiner*—Tan T. Nguyen
(74) *Attorney, Agent, or Firm*—Laurence A. Greenberg; Werner H. Stemer; Ralph E. Locher (57) ABSTRACT

Each memory cell of a cell configuration includes at least one memory transistor. To write first or second information on the memory cell, a gate electrode of the memory transistor is charged such that a first voltage or a second voltage is applied in the memory transistor. A reading voltage is applied in a second source/drain area of the memory transistor to read first information and second information respectively. The first voltage is applied between the second voltage and the reading voltage. The reading voltage is applied between the first voltage less a threshold voltage of the memory transistor and the second voltage less the threshold voltage of the memory transistor.

24 Claims, 3 Drawing Sheets

METHOD FOR OPERATING A MEMORY CELL CONFIGURATION HAVING DYNAMIC GAIN MEMORY CELLS

CROSS-REFERENCE TO RELATED APPLICATION

This application is a continuation of copending International Application No. PCT/DE00/00282, filed Feb. 1, 2000, which designated the United States.

BACKGROUND OF THE INVENTION

Field of the Invention

The invention lies in the field of integrated circuits. The invention relates to a method for operating a memory cell configuration having dynamic gain memory cells.

At present, a so-called one-transistor memory cell is usually used as a memory cell of a memory cell configuration. Such a memory cell includes a transistor and a capacitor on which information is stored in the form of a charge. By driving the transistor through a word line, it is possible for the charge on the capacitor to be read out through a bit line. Because the charge of the capacitor drives the bit line and a signal generated by the charge is intended to remain identifiable despite background noise, the capacitor must have a minimum capacitance. The minimum capacitance requirement placed on the capacitor constitutes an obstacle to increasing the packing density of the memory cell configuration because the size of the capacitor cannot be arbitrarily reduced.

The problem is avoided in an alternative memory cell configuration in which so-called gain cells, i.e., dynamic gain memory cells, are used as memory cells. In such a configuration, too, the information is stored in the form of an electrical charge. However, the electrical charge does not have to directly drive a bit line. Rather, it is stored on a gate electrode of a memory transistor and serves only for controlling the latter, for which purpose a very small quantity of electrical charge is already sufficient.

European Patent Application 537203, corresponding to U.S. Pat. No. 5,327,374 to Krautschneider et al., describes a memory cell configuration in which a memory cell is a dynamic gain memory cell including a selection transistor, a memory transistor, and a Shottky junction. A gate electrode of the selection transistor is connected to a word line. The selection transistor and the memory transistor are connected in series and between a bit line and a voltage terminal at which an operating voltage is present. The Shottky junction is connected between the gate electrode of the memory transistor and a source/drain region of the selection transistor. To write information to a memory cell, the associated word line drives the associated selection transistor. Depending on the type of information, a low voltage $U_{BL}$ or a high voltage $U_{BH}$ is applied to the bit line. The charge on the gate electrode of the memory transistor that is established in the process is dependent on the voltage on the bit line and represents the information. To read out the information, the selection transistor is driven through the word line and the low voltage $U_{BL}$ is applied to the bit line. If the gate electrode of the memory transistor was previously charged by the high voltage $U_{BH}$ on the bit line, then a voltage difference between the gate electrode and a source/drain region of the memory transistor arises that is greater than a threshold voltage of the memory transistor, with the result that a signal charge is brought about by a current between the voltage terminal and the bit line. If the gate electrode of the memory transistor was charged by the low voltage $U_{BL}$ on the bit line, then no voltage difference between the gate electrode and the source/drain region of the memory transistor arises that is greater than the threshold voltage of the memory transistor, resulting in no current flow.

The article by M. Heshami et al., "A 250-MHz Skewed-Clock Pipelined Data Buffer," IEEE Journal of Solid-State Circuits, Vol. 31, No. 3 (1996) 376, describes a memory cell configuration in which a memory cell is a dynamic gain memory cell that includes a first selection transistor, a memory transistor, and a second selection transistor. The first selection transistor is connected between a first bit line and a gate electrode of the memory transistor. A gate electrode of the first selection transistor is connected to a first word line. The second selection transistor is connected between a source/drain region of the memory transistor and a second bit line. A gate electrode of the second selection transistor is connected to a second word line. A further source/drain region of the memory transistor is connected to a voltage terminal. To write an information item to the gate electrode of the memory transistor, the first selection transistor is driven through the first word line, resulting in the establishment, on the gate electrode of the memory transistor, of a voltage that is dependent on a voltage on the first bit line, the magnitude of which, in turn, depends on the information to be written. To read out the information, the second selection transistor is driven through the second word line. Depending on the information, i.e., depending on the voltage on the gate electrode of the memory transistor, the memory transistor is in the on state or in the off state, and a current does or does not flow between the voltage terminal and the second bit line.

SUMMARY OF THE INVENTION

It is accordingly an object of the invention to provide a method for operating a memory cell configuration having dynamic gain memory cells that overcomes the hereinafore-mentioned disadvantages of the heretofore-known devices and methods of this general type and, in which, for a given operating voltage, a signal charge is greater than in comparison with the prior art.

With the foregoing and other objects in view, there is provided, in accordance with the invention, a method for operating a memory cell configuration having dynamic gain memory cells including the steps of providing memory cells each having at least one memory transistor with a gate electrode and first and second drain/source regions, writing a first information item to a memory cell by charging a gate electrode of a memory transistor of the memory cell with a first voltage, writing a second information item to the memory cell by charging the gate electrode of the memory transistor with a second voltage, respectively reading out the first information item and the second information item by applying an operating voltage to a first source/drain region of the memory transistor and applying a read-out voltage to a second source/drain region of the memory transistor, setting the first voltage to lie between the second voltage and the readout voltage, setting the read-out voltage to lie between the first voltage minus a threshold voltage of the memory transistor and the second voltage minus the threshold voltage of the memory transistor, and selecting the operating voltage such that the memory transistor is in an off state when the first information item is read out.

Providing a signal charge is greater than in comparison with the prior art can be achieved with a method for operating a memory cell configuration having dynamic gain memory cells, in which the memory cells each include at least one memory transistor. To write a first information item to one of the memory cells, a gate electrode of the associated memory transistor is charged such that a first voltage is present on it. To write a second information item to the memory cell, the gate electrode of the memory transistor is charged such that a second voltage is present on it. In each case, in order to read out the first information item and to read out the second information item, an operating voltage is applied to a first source/drain region of the memory transistor, and a read-out voltage is applied to a second source/drain region of the memory transistor. The first voltage lies between the second voltage and the read-out voltage. The read-out voltage lies between the first voltage minus a threshold voltage of the memory transistor and the second voltage minus the threshold voltage of the memory transistor.

The dynamic gain memory cell includes the memory transistor, on whose gate electrode the information is stored in the form of a charge. During writing, the charge is set such that, in the case of the first information item, the memory transistor is in the off state, i.e., no current can flow through the memory transistor, whereas it is in the on state in the case of the second information item. In contrast to the read-out of the first information item, a signal charge flows through the memory transistor when the second information item is read out. The signal charge flows between the first source/drain region and the second source/drain region of the memory transistor. A voltage difference between the gate electrode of the memory transistor and the second source/drain region of the memory transistor is greater than if the read-out voltage were equal to the first voltage because the read-out voltage is not equal to the first voltage and does not lie between the first voltage and the second voltage. An electrical resistance of the memory transistor is, thus, smaller, resulting in a particularly large signal charge flow therethrough. In comparison with the prior art, in which the first voltage is equal to the read-out voltage, a larger signal charge can flow for the same operating voltage. In comparison with the prior art, in which the first voltage is equal to the read-out voltage, the same signal charge can flow for a smaller operating voltage. Formulated in general terms, the operating voltage divided by the signal charge is smaller than in comparison with the prior art. For a given operating voltage, a signal charge is greater than in comparison with the prior art. The read-out voltage lies between the first voltage minus the threshold voltage of the memory transistor and the second voltage minus the threshold voltage of the memory transistor, so that the memory transistor is in the off state when the first information item is read out, and is in the on state when the second information item is read out. The process is based on the fact that a transistor is in the on state when a voltage difference between its gate electrode and at least one source/drain region is greater than the absolute value of its threshold voltage. The operating voltage is chosen such that the memory transistor is in the off state when the first voltage is present at its gate electrode. Otherwise, the memory transistor would be in the on state independently of the magnitude of the read-out voltage.

For example, if the memory transistor is an n-channel transistor in which the first and second source/drain regions are n-doped, then the second voltage is greater than the first voltage and the first voltage is greater than the read-out voltage. The read-out voltage is greater than the first voltage minus the threshold voltage of the memory transistor and less than the second voltage minus the threshold voltage of the memory transistor. The threshold voltage is greater than the first voltage minus the operating voltage. The threshold voltage is preferably greater than the second voltage minus the operating voltage. In such a case, the operating voltage may be present at the first source/drain region of the memory transistor even when the read-out voltage is not present at the second source/drain region of the memory transistor, without the memory transistor, therefore, being in the on state.

The same applies analogously to a memory cell configuration in which the memory transistor is a p-channel transistor. Thus, the first source/drain region and the second source/drain region of the memory transistor are p-doped. It is necessary merely to change the signs of the voltages. For example, the second voltage is, thus, less than the first voltage, and the first voltage is less than the read-out voltage.

Hereinafter, "voltage x is almost equal to y" means that x is as close as possible to y such that a given condition is still fulfilled.

The read-out voltage is preferably almost equal to the first voltage minus the threshold voltage of the memory transistor, i.e., is actually still large enough that, during read-out, no current flows through the memory transistor when the first voltage is present at its gate electrode. Thus, the sum of the read-out voltage and the threshold voltage is approximately 0 volts. Under the condition that the memory transistor is in the off state when the first information item is read out, the voltage difference between the second voltage and the read-out voltage is maximal in this case, resulting the memory transistor conducting a maximal amount of current. The signal charge is particularly large.

The first voltage is 0 V, for example. In such a case, the read-out voltage preferably amounts to almost the negative threshold voltage of the memory transistor. For the case where the memory transistor is an n-channel transistor, the read-out voltage is somewhat greater than the negative threshold voltage. If the threshold voltage is 1 volt, for example, then the read-out voltage is, e.g., minus 0.8 volts.

In accordance with another mode of the invention, the memory cell may include at least one selection transistor whose first source/drain region is connected to a bit line, whose second source/drain region is connected to the gate electrode of the memory transistor, and whose gate electrode is connected to a word line. To write the first information item, the word line is driven such that the gate electrode of the memory transistor is electrically connected to the bit line. A first bit line voltage is applied to the bit line such that the first voltage is present at the gate electrode of the memory transistor. To write the second information item to the memory cell, the word line is driven such that the gate electrode of the memory transistor is electrically connected to the bit line. A second bit line voltage is applied to the bit line such that the second voltage is present at the gate electrode of the memory transistor.

In accordance with a further mode of the invention, the second bit line voltage may be equal to the operating voltage.

For the sake of simplicity, reference is made below to a memory transistor that is an n-channel transistor. However, the same applies analogously to the case where the memory transistor is a p-channel transistor. It is necessary merely to change the signs of the voltages.

The selection transistor is preferably likewise an n-channel transistor if the memory transistor is an n-channel transistor.

In accordance with an added mode of the invention, in a first case, during the writing of the second information item, the word line can be driven by having applied to it a voltage that is equal to the sum of the operating voltage and a threshold voltage of the selection transistor. The selection transistor remains in the on state for as long as a voltage difference between its gate electrode and the first source/drain region or the second source/drain region is greater than its threshold voltage. Because the sum of the operating voltage and the threshold voltage is present at the gate electrode of the selection transistor and the operating voltage is present on the bit line, a current can flow until the operating voltage is likewise present at the gate electrode of the memory transistor. Consequently, the second voltage is equal to the operating voltage in the first case.

In accordance with an additional mode of the invention, in a second case, during the writing of the second information item, the operating voltage applied to the word line drives the word line. In such a case, during the writing of the second information item, current flows through the selection transistor only until the operating voltage minus the threshold voltage of the selection transistor is present at the gate electrode of the memory transistor. The charge on the gate electrode of the memory transistor is lower than in the first case. Because, during the read-out of the second information item, the voltage difference between the gate electrode and the second source/drain region of the memory transistor is smaller than in the first case, less current flows through the memory transistor than in the first case. The signal charge is thus smaller.

To simplify the method, it is advantageous to apply the same voltage to the word line during the writing of the first information item as during the writing of the second information item. In the second case, during the writing of the first information item, a voltage difference between the gate electrode of the selection transistor and its first source/drain region is then smaller than in the first case. As a result, the gate dielectric of the selection transistor can be thinner. The small thickness of the gate dielectric is advantageous because it leads to a high transconductance and to a high performance of the selection transistor. Due to the small thickness of the gate dielectric, performance characteristic data of the selection transistor can be so good that they satisfy the requirements for transistor of a logic circuit. Consequently, both the transistors of the memory cell configuration and the transistors of the logic circuit can be produced simultaneously on one chip.

The value of the voltage on the word line can be adapted to the respective requirements. The larger the signal charge is intended to be, the higher the voltage chosen. Preferably, the voltage is not greater than in the first case described above, because the second voltage at the gate electrode of the memory transistor cannot exceed the second bit line voltage. The thinner the gate dielectric is intended to be, the smaller the voltage chosen. It lies within the scope of the invention to make a compromise, so that the voltage on the word line lies between the operating voltage and the sum of the operating voltage and the threshold voltage.

To reduce the process complexity during the fabrication of the memory cell configuration, it is advantageous if the selection transistor and the memory transistor are produced simultaneously, so that their gate dielectrics have the same thicknesses. The selection transistor and the memory transistor can have the same threshold voltage.

In accordance with yet another mode of the invention, the memory cell may include at least one diode connected between the second source/drain region of the selection transistor and the gate electrode of the memory transistor such that it becomes more difficult for charge to flow away from the gate electrode of the memory transistor to the second source/drain region of the selection transistor. Thus, the reverse direction of the diode points from the gate electrode of the memory transistor to the second source/drain region of the selection transistor. The second source/drain region of the selection transistor is connected to the second source/drain region of the memory transistor. To read out the first information item and to read out the second information item, the word line is driven, so that the selection transistor acts as a read-out transistor. Thus, only one bit line and one word line are provided per memory cell. When choosing the thickness of the gate dielectric of the selection transistor, it is necessary to take into account not only the difference between the voltage on the word line and the first bit line voltage but also the difference between the voltage on the word line and the read-out voltage.

Hereinafter, the term "read-out transistor" is interchangeable with the term "selection transistor" for the case of a memory cell with diode.

The memory cell configuration can be constructed particularly simply if the same voltage is applied to the word line both during writing and during read-out.

In the first case described above, the maximum voltage difference between the gate electrode and the first source/drain region of the selection transistor is then equal to the sum of the operating voltage and the threshold voltage minus the read-out voltage. The voltage difference is, therefore, almost equal to the sum of the operating voltage and twice the threshold voltage. In the second case described above, the maximum voltage difference between the gate electrode and the first source/drain region of the selection transistor is equal to the operating voltage minus the read-out voltage. Thus, the voltage difference is almost equal to the sum of the operating voltage and the threshold voltage of the memory transistor.

In accordance with yet a further mode of the invention, the memory cell may be a three-transistor memory cell, as is described, e.g., in M. Heshami et al. (see above). For example, the memory cell includes a read-out transistor whose first source/drain region is connected to the second source/drain region of the memory transistor. To read out the first information item and to read out the second information item, a gate electrode of the read-out transistor is driven. The gate electrode of the read-out transistor is connected to a further word line, for example. A second source/drain region of the read-out transistor may be connected to a further bit line through which the signal charge is determined. The word line and the further word line may be identical. In such a case, the bit line and the further bit line are different from one another. The bit line and the further bit line may be identical. In such a case, the word line and the further word line are different from one another.

If the memory cell includes the diode, the gate dielectric of the selection transistor can be particularly thin if a smaller voltage is applied to the word line during read-out than during writing. Preferably, the voltage on the word line is adapted to the read-out voltage such that a voltage drop across the gate dielectric of the selection transistor is the same both during writing and during read-out. In the first case described above, the voltage on the word line during read-out is then equal to the sum of the operating voltage, the threshold voltage, and the read-out voltage. As a result, the maximum voltage difference between the gate electrode and the first source/drain region of the selection transistor that is dropped across the gate dielectric of the selection transistor during operation of the memory cell configuration is equal to the sum of the operating voltage and the threshold voltage. The voltage on the word line during read-out is, e.g., almost equal to the operating voltage. In the second case described above, the voltage on the word line during read-out is then equal to the sum of the operating voltage and the read-out voltage. As a result, the maximum voltage difference between the gate electrode and the first source/drain region of the selection transistor that is dropped across the gate dielectric of the selection transistor during operation of the memory cell configuration is equal to the operating voltage. The voltage on the word line during read-out is, e.g., almost equal to the operating voltage minus the threshold voltage of the read-out transistor.

To ensure that an increased leakage current is not produced between the first source/drain region of the read-out transistor and a substrate in which the first source/drain region of the read-out transistor is disposed, when the read-out voltage is present, it is advantageous if a voltage that is not greater than the read-out voltage is present across the substrate. P-n junctions between source/drain regions of the transistors and the substrate are then reverse-biased.

The first source/drain region of the memory transistor may be connected to a voltage terminal that is kept constant at the operating voltage.

In accordance with a concomitant mode of the invention, the memory cell configuration of the memory cells is in a substrate across which there is a voltage equal to or less than the read-out voltage when the read-out transistor is an n-channel transistor, and equal to or greater than the readout voltage when the read-out transistor is a p-channel transistor.

Other features that are considered as characteristic for the invention are set forth in the appended claims.

Although the invention is illustrated and described herein as embodied in a method for operating a memory cell configuration having dynamic gain memory cells, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case.

The exemplary embodiments are based on a memory cell configuration having dynamic gain memory cells, in which the memory cells each have a memory transistor S, a selection transistor A and a diode D. The selection transistor A and the memory transistor S are connected in series and between a voltage terminal Q and a bit line B. A first source/drain region of the memory transistor S is connected to the voltage terminal Q. A first source/drain region of the selection transistor A is connected to the bit line B. A second source/drain region of the selection transistor A is connected to a gate electrode of the memory transistor S and to a second source/drain region of the memory transistor S. The diode D is connected between the second source/drain region of the selection transistor A and the gate electrode of the memory transistor S such that it becomes more difficult for charge to flow away from the gate electrode of the memory transistor S to the second source/drain region of the selection transistor A. The voltage terminal is kept constant at an operating voltage $V_{DD}$ of 2 V. The source/drain regions of the selection transistor A and of the memory transistor S are n-doped, i.e., the selection transistor A and the memory transistor S are n-channel transistors. A threshold voltage $V_T$ of the selection transistor A and a threshold voltage $V_T$ of the memory transistor S are approximately 1 V. The source/drain regions of the selection transistor A and of the memory transistor S are disposed in a substrate across which there is a voltage of −1 V.

Figure 1:
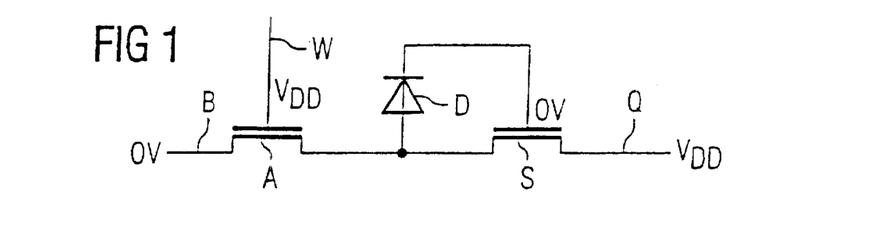
FIG. 1 is a schematic circuit diagram of a memory cell during a writing of a first information item in accordance with a first exemplary embodiment of the invention.

Referring now to the figures of the drawings in detail and first, particularly to FIG. 1 thereof, in a first exemplary embodiment, to write a first information item that corresponds to the logic value 0, the operating voltage $V_{DD}$ is applied to the word line W. As a result, the selection transistor A is in the on state. A first bit line voltage of 0 V is applied to the bit line B. As a result, at the gate electrode of the memory transistor S, a first voltage is established that is also 0 V. Because the first voltage is less than the threshold voltage $V_T$, the memory transistor S is in the off state. No current flows between the voltage terminal Q and the bit line B. See FIG. 1.

Figure 2:
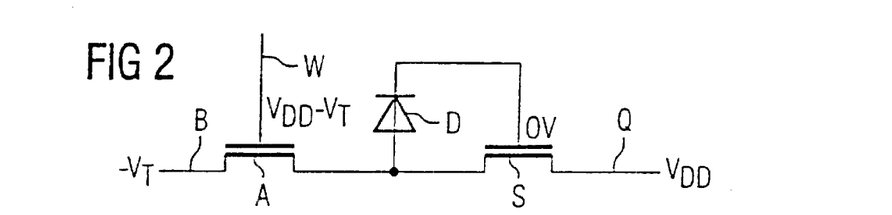
FIG. 2 is a schematic circuit diagram of the memory cell of FIG. 1 during a read-out of the first information item.

To read out the first information item, the word line W has applied to it a voltage that is equal to the operating voltage $V_{DD}$ minus a threshold voltage $V_T$. As a result, the selection transistor A is in the on state. See FIG. 2. A read-out voltage that is equal to the negative threshold voltage $V_T$ Of the selection transistor A is applied to the bit line B. The diode D is reverse-biased, with the result that only a very slight charge flows from the gate electrode of the memory transistor S to the bit line B. Although the read-out voltage is less than the first voltage at the gate electrode of the memory transistor S, its difference is less than the threshold voltage $V_T$. As a result, the memory transistor is in the off state and no current flows from the voltage terminal Q to the bit line B. A voltage difference between the gate electrode of the selection transistor A and the source/drain regions of the selection transistor A is never more than the operating voltage $V_{DD}$. See FIG. 2.

Figure 3:
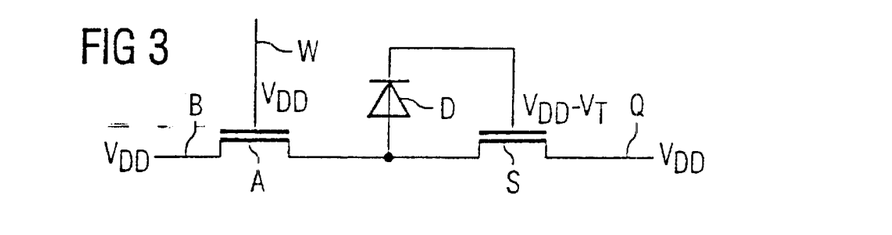
FIG. 3 is a schematic circuit diagram of the memory cell of FIG. 1 during a writing of a second information item.

To write a second information item that corresponds to the logic value 1, the operating voltage $V_{DD}$ is applied to the word line W. See FIG. 3. As a result, the selection transistor A is in the on state. The operating voltage $V_{DD}$ is applied to the bit line B. As a result, on the gate electrode of the memory transistor S, a second voltage is established that is equal to the operating voltage $V_{DD}$ minus the threshold voltage $V_T$. The second voltage is not equal to the operating voltage $V_{DD}$ because the selection transistor A is in the on state only for as long as a voltage difference between the gate electrode of the selection transistor A and one of its source/drain regions is greater than the threshold voltage $V_T$. See FIG. 3.

Figure 4:
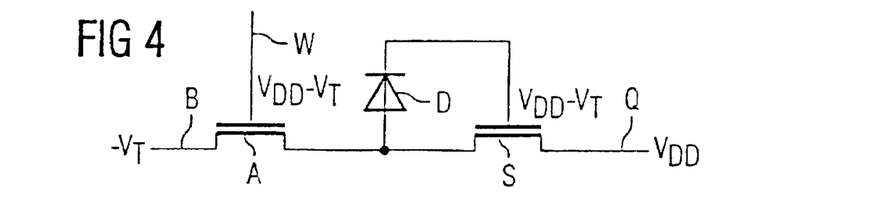
FIG. 4 is a schematic circuit diagram of the memory cell of FIG. 1 during a read-out of the second information item.

To read out the second information item, a voltage that is equal to the operating voltage $V_{DD}$ minus the threshold voltage $V_T$ is applied to the word line W. See FIG. 4. The read-out voltage is applied to the bit line B. The diode D is reverse-biased. As a result, charge only flows away slowly from the gate electrode of the memory transistor S to the bit line B. Because the read-out voltage is less than the second voltage and their difference, i.e., the voltage difference between the gate electrode of the memory transistor S and the bit line B, is greater than the threshold voltage $V_T$, namely being equal to the operating voltage $V_{DD}$, the memory transistor S is in the on state and a current flows from the voltage terminal Q to the bit line B. See FIG. 4. The fact that the second information item is involved is identified from the resulting signal charge. A voltage difference between the gate electrode of the memory transistor S and its source/drain regions is never more than the operating voltage $V_{DD}$.

During the read-out of an information item of another memory cell, on whose bit line the read-out voltage is present, a voltage that is preferably equal to the negative threshold voltage $V_T$ of the memory transistor S is applied to the word line W. See FIG. 5. A voltage difference between the first source/drain region of the read-out transistor A and its gate electrode is minimal in such a case. As a result, leakage currents through the read-out transistor are likewise minimal. If the second information item is stored in the memory cell, then a voltage difference between the gate electrode of the selection transistor A and the second source/drain region of the selection transistor A amounts to the operating voltage $V_{DD}$. See FIG. 5.

Figure 5:
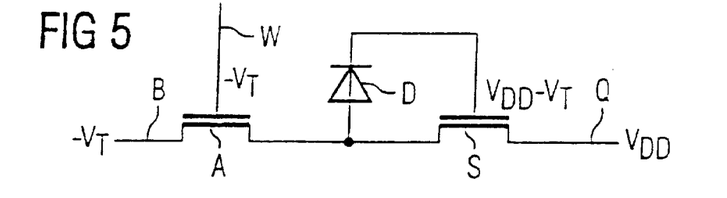
FIG. 5 is a schematic circuit diagram of the memory cell of FIG. 1 during a read-out of an information item of another memory cell.

During times when information is not being written to the memory cell or information is not being read from the memory cell, the negative threshold voltage $V_T$ is present on the word line W and 0 V is present on the bit line B.

Because the voltage difference between the gate electrode of the selection transistor A and its source/drain regions and a voltage difference between the gate electrode of the memory transistor S and its source/drain regions is never greater than the operating voltage $V_{DD}$, gate dielectrics of the selection transistor A and of the memory transistor S can have a small thickness. In the exemplary embodiment, the thicknesses of the gate dielectrics are approximately 4 nm and are composed of $SiO_2$.

A logic circuit is also disposed on the substrate on which the memory cell configuration is located. Because the gate dielectrics of the selection transistor A and of the memory transistor S are thin, transistors of the logic circuit can be produced at the same time as the memory cell configuration, and, due to the small thickness of their gate dielectrics, the transistors of the logic circuit have a high transconductance and a high performance.

Figure 6:
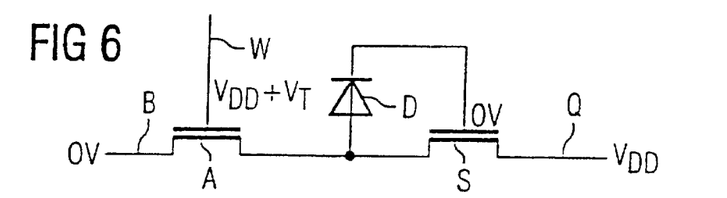
FIG. 6 is a schematic circuit diagram of a memory cell during a writing of a first information item in accordance with a second exemplary embodiment of the invention.

In a second exemplary embodiment, to write the first information item and the second information item, a voltage that is equal to the sum of the operating voltage $V_{DD}$ and the threshold voltage $V_T$ is applied to the word line W. During the writing of the first information item, the voltage 0 V is applied to the bit line B. The voltage difference between the gate electrode of the selection transistor and its first source/drain region is $V_{DD}+V_T$. See FIG. 6.

Figure 7:
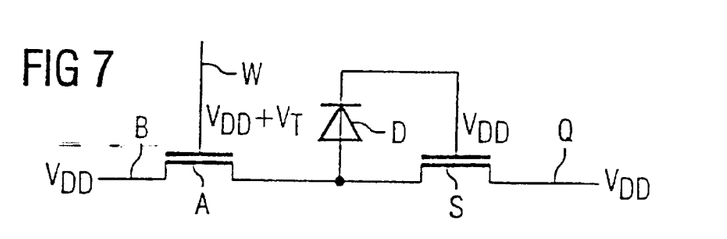
FIG. 7 is a schematic circuit diagram of the memory cell of FIG. 6 during a writing of a second information item.

To write the second information item, the operating voltage $V_{DD}$ is applied to the bit line. As a result, the operating voltage $V_{DD}$ is established at the gate electrode of the memory transistor S. See FIG. 7. Thus, the second voltage is greater in the second exemplary embodiment than in the first exemplary embodiment.

Figure 8:
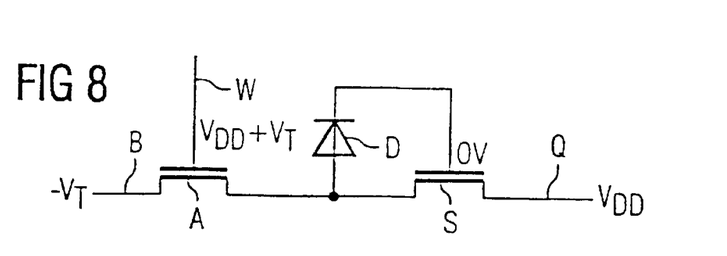
FIG. 8 is a schematic circuit diagram of the memory cell of FIG. 6 during a read-out of the first information item.

As in the case of writing, it is also the case during the read-out of the first information item and/or of the second information item that the voltage $V_{DD}+V_T$ is applied to the word line W. See FIGS. 8 and 9. A read-out voltage corresponding to the read-out voltage from the first exemplary embodiment is applied to the bit line B. Thus, the read-out voltage is almost $-V_T$. In contrast to the first exemplary embodiment, the voltage difference between the gate electrode of the memory transistor S and the bit line B during the read-out of the second information item is $V_{DD}+V_T$. See FIG. 9. Thus, the electrical resistance of the memory transistor S is smaller than in the case of the first exemplary embodiment. As a result, more current flows from the voltage terminal Q to the bit line B, and the signal charge is consequently larger.

Figure 9:
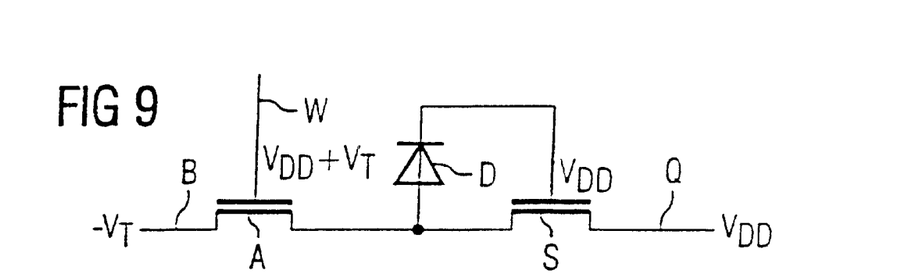
FIG. 9 is a schematic circuit diagram of the memory cell of FIG. 6 during a read-out of the second information item.

During the read-out of the first information item or of the second information item, a voltage difference between the gate electrode of the selection transistor A and the bit line B is $V_{DD}+2 V_T$. Due to the large voltage difference, the gate dielectric of the selection transistor A is thicker than in the case of the first exemplary embodiment and is approximately 8 nm. In the case of the memory transistor S, too, during the read-out of the second information item, the voltage difference between the gate electrode and the bit line B, with $V_{DD}+V_T$, is greater than in the case of the first exemplary embodiment. As a result, the gate dielectric of the memory transistor S should be thicker than in the case of the first exemplary embodiment. So that the memory cell configuration can be fabricated with low process complexity, the thickness of the gate dielectric of the memory transistor S is equal to the thickness of the gate dielectric of the selection transistor A.

An information item of another memory cell is read out in a manner corresponding to the first exemplary embodiment. See FIG. 10.

Figure 10:
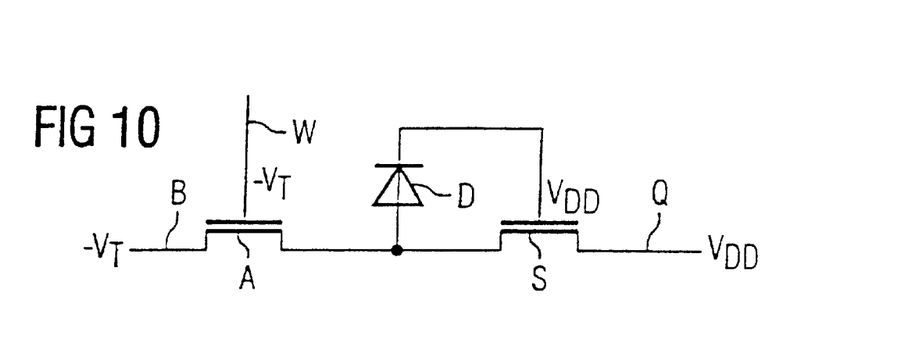
FIG. 10 is a schematic circuit diagram of the memory cell of FIG. 6 during a read-out of an information item of another memory cell.

During times when information is not being written to the memory cell or information is not being read from the memory cell, $-V_T$ is present on the word line W and 0 V is present on the bit line B.

There are many conceivable variations of the exemplary embodiments that likewise lie within the scope of the invention. Thus, the operating voltage and the threshold voltage can be adapted to the respective requirements. A capacitor can be connected between the diode and the gate electrode of the memory transistor to increase the capacitance at the gate electrode of the memory transistor.

The memory cell can be a three-transistor memory cell.

We claim:

1. A method for operating a memory cell configuration having dynamic gain memory cells, which comprises:

providing memory cells each having at least one memory transistor with a gate electrode and first and second drain/source regions;

writing a first information item to a memory cell by charging a gate electrode of a memory transistor of the memory cell with a first voltage;

writing a second information item to the memory cell by charging the gate electrode of the memory transistor with a second voltage;

respectively reading out the first information item and the second information item by applying an operating voltage to a first source/drain region of the memory transistor and applying a read-out voltage to a second source/drain region of the memory transistor;

setting the first voltage to lie between the second voltage and the read-out voltage;

setting the read-out voltage to lie between:
  the first voltage minus a threshold voltage of the memory transistor and
  the second voltage minus the threshold voltage of the memory transistor; and selecting the operating voltage such that the memory transistor is in an off state when the first information item is read out.

2. The method according to claim 1, which further comprises setting a sum of the read-out voltage and the threshold voltage to be approximately 0 volts.

3. The method according to claim 1, which further comprises setting the first voltage to 0 volts.

4. The method according to claim 1, wherein the memory cell has at least one selection transistor with a gate electrode and first and second drain/source regions, and which further comprises:

connecting a first source/drain region of a respective selection transistor to a bit line;

connecting a second-source/drain region of the selection transistor to the gate electrode of the memory transistor;

connecting a gate electrode of the selection transistor to a word line;

writing the first information item to the memory cell by driving the word line to electrically connect the gate electrode of the memory transistor to the bit line and by applying a first bit line voltage to the bit line such that the first voltage is present on the gate electrode of the memory transistor; and writing the second information item to the memory cell by driving the word line to electrically connect the gate electrode of the memory transistor to the bit line and by applying a second bit line voltage to the bit line such that the second voltage is present on the gate electrode of the memory transistor.

5. The method according to claim 4, which further comprises:

setting the second bit line voltage equal to the operating voltage; and driving the word line during the writing of the first information item and during the writing of the second information item by applying a voltage to the word line equal to a sum of the operating voltage and a threshold voltage of the selection transistor, so that the second voltage is equal to the operating voltage.

6. The method according to claim 4, which further comprises:

setting the second bit line voltage equal to the operating voltage; and driving the word line during the writing of the first information item and during the writing of the second information item by applying the operating voltage to the word line, so that the second voltage is equal to the operating voltage minus a threshold voltage of the selection transistor.

7. The method according to claim 4, which further comprises:

increasing a difficulty for charge to flow away from the gate electrode of the memory transistor to a second source/drain region of the selection transistor by connecting at least one diode of the memory cell between the second source/drain region of the selection transistor and the gate electrode of the memory transistor;

connecting the second source/drain region of the selection transistor to the second source/drain region of the memory transistor; and respectively reading out the first information item and the second information item by driving the word line so that the selection transistor acts as a read-out transistor.

8. The method according to claim 7, which further comprises respectively reading out the first information item and the second information item by applying a voltage equal to a sum of the operating voltage and the read-out voltage to the gate electrode of the read-out transistor.

9. The method according to claim 7, which further comprises providing a memory cell configuration of the memory cells in a substrate across which there is a voltage:

equal to or less than the read-out voltage when the read-out transistor is an n-channel transistor; and equal to or greater than the read-out voltage when the read-out transistor is a p-channel transistor.

10. The method according to claim 4, which further comprises:

connecting a first source/drain region of a read-out transistor of the memory cell to the second source/drain region of the memory transistor; and respectively reading out the first information item and the second information item by driving a gate electrode of the read-out transistor.

11. The method according to claim 10, which further comprises respectively reading out the first information item and the second information item by applying a voltage equal to a sum of the operating voltage and the read-out voltage to the gate electrode of the read-out transistor.

12. The method according to claim 10, which further comprises providing a memory cell configuration of the memory cells in a substrate across which there is a voltage:

equal to or less than the read-out voltage when the read-out transistor is an n-channel transistor; and equal to or greater than the read-out voltage when the read-out transistor is a p-channel transistor.

13. A method for operating a memory cell configuration having dynamic gain memory cells, which comprises:

providing memory cells each having at least one memory transistor with a gate electrode and first and second drain/source regions;

charging a gate electrode of a memory transistor of a memory cell to a first voltage to enable writing of a first information item to the memory cell;

charging a gate electrode of the memory transistor to a second voltage to enable writing of a second information item to the memory cell;

applying an operating voltage to a first source/drain region of the memory transistor and applying a read-out voltage to a second source/drain region of the memory transistor to respectively enable reading out of the first information item and the second information item, the first voltage lying between the second voltage and the read-out voltage, and the read-out voltage lying between:

the first voltage minus a threshold voltage of the memory transistor; and the second voltage minus the threshold voltage of the memory transistor; and selecting the operating voltage such that the memory transistor is in an off state when the first information item is read out.

14. The method according to claim 13, which further comprises setting a sum of the read-out voltage and the threshold voltage to be approximately 0 volts.

15. The method according to claim 13, which further comprises setting the first voltage to 0 volts.

16. The method according to claim 13, wherein the memory cell has at least one selection transistor with a gate electrode and first and second drain/source regions, and which further comprises:

connecting a first source/drain region of a respective selection transistor to a bit line;

connecting a second source/drain region of the selection transistor to the gate electrode of the memory transistor;

connecting a gate electrode of the selection transistor to a word line;

driving the word line to electrically connect the gate electrode of the memory transistor to the bit line and applying a first bit line voltage to the bit line such that the first voltage is present on the gate electrode of the memory transistor to enable writing of the first information item to the memory cell; and driving the word line to electrically connect the gate electrode of the memory transistor to the bit line and applying a second bit line voltage to the bit line such that the second voltage is present on the gate electrode of the memory transistor to enable writing of the second information item to the memory cell.

17. The method according to claim 16, which further comprises:

setting the second bit line voltage equal to the operating voltage; and applying a voltage to the word line equal to a sum of the operating voltage and a threshold voltage of the selection transistor, so that the second voltage is equal to the operating voltage, to enable driving of the word line during the writing of the first information item and during the writing of the second information item.

18. The method according to claim 16, which further comprises:

setting the second bit line voltage equal to the operating voltage; and applying the operating voltage to the word line, so that the second voltage is equal to the operating voltage minus a threshold voltage of the selection transistor, to enable driving of the word line during the writing of the first information item and during the writing of the second information item.

19. The method according to claim 16, which further comprises:

increasing a difficulty for charge to flow away from the gate electrode of the memory transistor to a second source/drain region of the selection transistor by connecting at least one diode of the memory cell between the second source/drain region of the selection transistor and the gate electrode of the memory transistor;

connecting the second source/drain region of the selection transistor to the second source/drain region of the memory transistor; and driving the word line to enable respective reading out of the first information item and the second information item so that the selection transistor acts as a read-out transistor.

20. The method according to claim 19, which further comprises applying a voltage equal to a sum of the operating voltage and the read-out voltage to the gate electrode of the read-out transistor to enable respective reading out of the first information item and the second information item.

21. The method according to claim 19, which further comprises providing a memory cell configuration of the memory cells in a substrate across which there is a voltage:

equal to or less than the read-out voltage when the read-out transistor is an n-channel transistor; and equal to or greater than the read-out voltage when the read-out transistor is a p-channel transistor.

22. The method according to claim 16, which further comprises:

connecting a first source/drain region of a read-out transistor of the memory cell to the second source/drain region of the memory transistor; and driving a gate electrode of the read-out transistor to enable respective reading out of the first information item and the second information item.

23. The method according to claim 22, which further comprises applying a voltage equal to a sum of the operating voltage and the read-out voltage to the gate electrode of the read-out transistor to enable respective reading out of the first information item and the second information-item.

24. The method according to claim 22, which further comprises providing a memory cell configuration of the memory cells in a substrate across which there is a voltage:

equal to or less than the read-out voltage when the read-out transistor is an n-channel transistor; and equal to or greater than the read-out voltage when the read-out transistor is a p-channel transistor.

* * * * *